United States Patent
Hunt, Jr. et al.

(10) Patent No.: US 6,385,276 B1
(45) Date of Patent: May 7, 2002

(54) DUAL-MODULUS PRESCALER

(75) Inventors: Barry Travis Hunt, Jr.; Scott Robert Humphreys, both of Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/879,670

(22) Filed: Jun. 12, 2001

(51) Int. Cl.[7] ............................................. H03K 21/00
(52) U.S. Cl. ........................................ 377/47; 377/48
(58) Field of Search ..................... 377/47, 48

(56) References Cited

U.S. PATENT DOCUMENTS

| | | | |
|---|---|---|---|
| 4,609,881 A | 9/1986 | Wells | 331/1 A |
| 4,920,282 A | 4/1990 | Muraoka | 307/442 |
| 4,953,187 A | 8/1990 | Herold | 337/48 |
| 4,965,531 A | 10/1990 | Riley | 331/1 A |
| 4,991,187 A | 2/1991 | Herold | 337/48 |
| 5,022,054 A | 6/1991 | Wang | 375/64 |
| 5,038,117 A | 8/1991 | Miller | 331/16 |
| 5,055,800 A | 10/1991 | Black | 331/1 A |
| 5,055,802 A | 10/1991 | Hietala | 331/16 |
| 5,058,427 A | 10/1991 | Brandt | 73/384 |
| 5,068,875 A | 11/1991 | Quintin | 375/78 |
| 5,070,310 A | 12/1991 | Hietala | 331/1 A |
| 5,079,522 A | 1/1992 | Owen | 331/16 |
| 5,093,632 A | 3/1992 | Hietala | 331/1 A |
| 5,111,162 A | 5/1992 | Hietala | 332/127 |
| 5,166,642 A | 11/1992 | Hietala | 331/1 A |
| 5,281,865 A | 1/1994 | Yamashita | 307/279 |
| 5,301,367 A | 4/1994 | Heinonen | 455/76 |
| 5,305,362 A * | 4/1994 | Miller | 377/48 |
| 5,337,024 A | 8/1994 | Collins | 332/127 |
| 5,365,548 A | 11/1994 | Baker | 375/62 |
| 5,493,700 A | 2/1996 | Hietala | 455/75 |
| 5,495,206 A | 2/1996 | Hietala | 331/1 A |

(List continued on next page.)

OTHER PUBLICATIONS

Chang, Byngsoo, et al. "A 1.2 GHz CMOS Dual–Modulus Prescaler Using New Dynamic D–Type Flip–Flops," IEEE Journal of Solid–State Circuits, vol. 31, No. 5, May, 1996, pp. 749–752.

Huang, Qiuting, and Rogenmoser, Robert, "Speed Optimization of Edge–Triggered CMOS Circuits for Gigahertz Single–Phase Clocks," IEEE Jounral of Solid–State Circuits, vol. 31, No. 3, Mar., 1996 pp. 456–465.

Motorola Semiconductor Technical Data, "The Technique of Direct Programming by Using a Two–Modulus Prescaler," Originally printed May 1981, reformatted Oct. 1995, Document No. AN827/D.

Owen, David, "Fractional–N Synthesizers," IFR Application Note, IFR Americas, 2001, www.ifrsys.com.

Pohjonen, H. and Ronkainen, H., "A 1 GHz CMOS Prescaler for RF Synthesizers," 1988 Proceedings of ISCAS, pp. 377–380, CH2458–8/88/0000–0377.

(List continued on next page.)

Primary Examiner—Margaret R. Wambach
(74) Attorney, Agent, or Firm—Withrow & Terranova, P.L.L.C.

(57) ABSTRACT

A dual-modulus digital prescaler circuit having an extended period in which responses to a divider control indicating a possible modulus change must be made, such extended period permitting higher speed operation while suffering no penalty in manufacturing cost or increased power use. In embodiments comprising a dual modulus divider, a fixed-modulus divider and interconnected control logic, dual modulus divider state transitions giving rise to incrementing of fixed-modulus divider states are selected to be independent of short-term instabilities in divider control inputs. Identified critical state transitions associated with output signals from the dual modulus divider are constrained to occur at times prior to periods of insensitivity to stability of the dual-modulus control signal. Thus, timing of such output signals is determined so that there will be following time interval sufficient to provide desired stability of the modulus control signal for the next divide cycle.

26 Claims, 5 Drawing Sheets

U.S. PATENT DOCUMENTS

| | | | |
|---|---|---|---|
| 5,552,738 A | 9/1996 | Ko | 327/203 |
| 5,592,114 A | 1/1997 | Wu | 327/208 |
| 5,684,795 A | 11/1997 | Daniel | 370/347 |
| 5,745,848 A | 4/1998 | Robin | 455/296 |
| 5,777,521 A | 7/1998 | Gillig | 331/16 |
| 5,778,028 A | 7/1998 | Turner | 375/229 |
| 5,822,366 A | 10/1998 | Rapeli | 375/219 |
| 5,825,257 A | 10/1998 | Klymyshyn | 332/100 |
| 5,857,004 A | 1/1999 | Abe | 375/344 |
| 5,859,890 A | 1/1999 | Shurboff | 377/48 |
| 5,883,930 A | 3/1999 | Fukushi | 375/376 |
| 5,892,385 A | 4/1999 | Hashiguchi | 327/333 |
| 5,898,330 A | 4/1999 | Klass | 327/210 |
| 5,900,758 A | 5/1999 | Kanno | 327/201 |
| 5,917,355 A | 6/1999 | Klass | 327/208 |
| 5,920,556 A | 7/1999 | Jorgensen | 370/350 |
| 5,933,038 A | 8/1999 | Klass | 327/208 |
| 5,943,613 A | 8/1999 | Wendelrup | 455/343 |
| 6,008,703 A | 12/1999 | Perrott | 332/100 |
| 6,008,704 A | 12/1999 | Opsahl | 332/127 |
| 6,043,696 A | 3/2000 | Klass | 327/211 |
| 6,060,927 A | 5/2000 | Lee | 327/218 |
| 6,064,272 A | 5/2000 | Rhee | 331/16 |
| 6,097,259 A | 8/2000 | Saito | 332/103 |
| 6,100,730 A | 8/2000 | Davis | 327/117 |
| 6,121,807 A | 9/2000 | Klass | 327/218 |
| 6,154,077 A | 11/2000 | Waible | 327/185 |
| 6,163,710 A | 12/2000 | Blaser | 455/552 |

OTHER PUBLICATIONS

Rogenmoser, R. et al., "1.57 GHz Asynchronous and 1.4 GHz Dual–Modulus 1.2 micrometer CMOS Prescalers," IEEE Customer Integrated Circuits Conference, 1994, pp. 387–390, 0–7803–1886–2/94.

Yang, Ching–Yuan, and Liu, Shen–Iuan, "Fast–Switching Frequency Synthesizer with a Discriminator–Aided Phase Detector," IEEE Journal of Solid–State Circuits, vol. 35, No. 10, Oct. 2000, pp. 1445–1452, 0018–9200/00.

Yuan, Jiren, and Svensson, Christer, "High–Speed CMOS Circuit Technique," IEEE Journal of Solid–State Circuits, vol. 24, No. 1, Feb. 1989, pp. 62–70, 0018–9200/89.

Yuan, Jiren and Svensson, Christer, "New Single–Clock CMOS Latches and Flipflops with Improved Speed and Power Savings," IEEE Journal of Solid–State Circuits, vol. 32, No. 1, Jan. 1997, pp. 62–69, 0018–9200/97.

Razavi, Behzad, "RF Microelectronics," Prentice Hall PTR, Upper Saddle River, NJ, 1998.

\* cited by examiner

DUAL-MODULUS PRESCALER

RELATED APPLICATIONS

The present application is related to concurrently filed non-provisional applications:

(i) Ser. No. 09/879,806, still pending, by A. W. Hietala entitled Fractional-N Modulation with Analog IQ Interface;

(ii) Ser. No. 09/879,672, still pending by S. R. Humphreys and A. W. Hietala entitled Fractional-N Synthesizer with Improved Noise Performance;

(iii) Ser. No. 09/879,808, still pending, by S. R. Humphreys and A. W. Hietala entitled Accumulator with Programmable Full-Scale Range; and (iv) Ser. No. 09/879,671, still pending, by B. T. Hunt and S. R. Humphreys entitled True Single-Phase Flip-Flop;

which non-provisional applications are assigned to the assignee of the present invention, and are hereby incorporated in the present application as if set forth in their entirety herein.

FIELD OF THE INVENTION

The present invention relates to circuitry for counting or dividing. More particularly, the present invention relates to frequency prescaler circuits. Still more particularly, the present invention relates to dual modulus prescaler circuits for use in frequency synthesizers.

BACKGROUND OF THE INVENTION

Prescaler circuits for use in high-speed dividers, frequency synthesizers and the like are well known in the art. A dual modulus prescaler is a divider whose division ratio or modulus can be switched from one value to another by a control signal. Commonly known implementations of prescalers utilize a counter circuit consisting of series-coupled flip-flop circuits that are used to obtain an output whose frequency is a fraction of that of a clock signal. Thus, a prescaler can divide by a first factor when a control signal has a first state or by a second factor when the control signal has a second state. Aspects of prescaler circuits and component dual modulus dividers used in a variety of RF contexts are described generally in B. Razavi,*RF Microelectronics*, Prentice-Hall PTR, 1998, especially pp. 269–297.

Many electronic devices, including mobile radiotelephones operating in the 800–900 MHz and higher frequency bands require prescalers operating at correspondingly high frequencies under a variety of conditions. Further, many such applications of prescaler circuits place low power dissipation requirements for to enhance portability and extend period of use between battery recharges. In addition, prescalers for use in many portable devices advantageously operate at low supply voltage levels.

Figure 1:
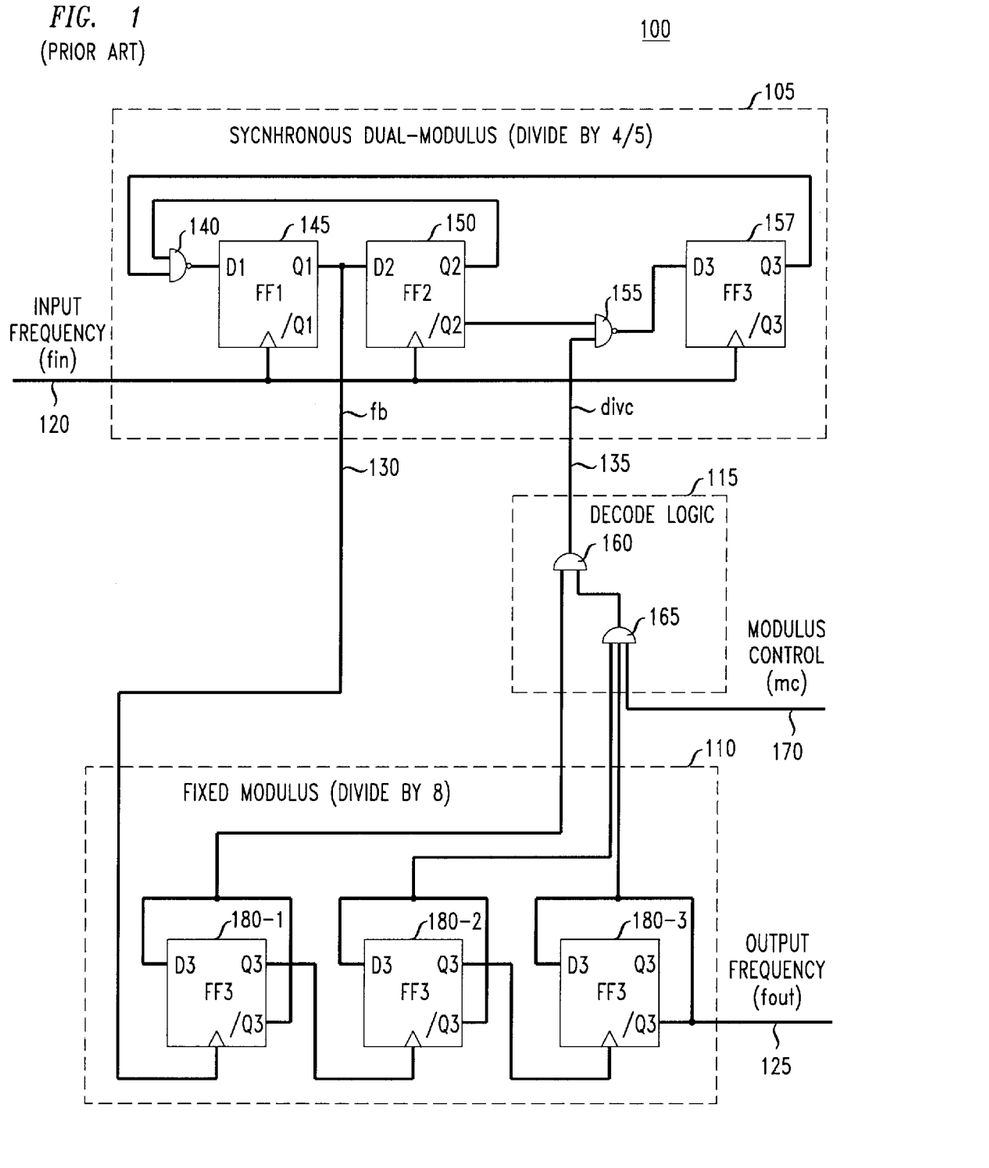
FIG. 1 shows a prior art prescaler circuit.

FIG. 1 shows a typical prior art prescaler circuit 100 comprising three sub-circuits: a synchronous dual-modulus divider (illustratively a divide by 4/5 divider) 105; a fixed-modulus divider (illustratively divide by 8) 110; and decode logic 115.

As suggested by its name, synchronous dual-modulus divider 105 will, depending on the state of divider control signal divc on path 135, divide an input frequency clock signal fin (applied on path 120 to each of three D-type flip-flops 145, 150 and 157) by either 4 or 5. Each of flip-flops 145, 150 and 157 has a Q and a/Q (Q-bar) output, and feedback paths from the Q outputs of flip-flops 150 and 157 to the D input to flip-flop 145 (input D1).

Fixed modulus divider 110 in FIG. 1 receives divided clock pulses fb from dual-modulus divider 105 over path 130 to flip-flop 180-1 and counts them in standard fashion using flip-flops 180-i, i=1, 2, 3. In particular, transitions of flip-flop 180-1 are triggered by rising edges of divided clock pulses on fb. Output fout appearing on path 125 is the desired divided output frequency signal. In selectively supplying binary state signals for divc, decode logic 115, including AND gates 160 and 165, receives inputs from flip-flops 180-i in fixed modulus divider 110 and a modulus control signal mc on lead 170.

In one application of the circuit of FIG. 1, operation as either a divide-by-32 or divide-by-33 circuit is achieved. Divide-by-32 operation is obtained if the dual-modulus divider 105 operates in divide-by-4 mode for eight cycles, accounting for 32 cycles of the input clock signal fin on path 120. These eight cycles of dual-modulus divider 105 comprise one full cycle of the fixed modulus divider 110 and, therefore, of prescaler 100. Divide-by-33 operation is obtained if dual-modulus divider 105 operates in divide-by-5 mode for one cycle (five cycles of input clock fin), and in divide-by-4 mode for seven cycles (28 cycles of fin), for a total of 33 cycles of fin. The eight cycles of dual-modulus divider 110 again comprise one full cycle of the fixed-modulus divider 100, and therefore of prescaler 100.

The divc signal on path 135 determines the mode of operation of the dual-modulus divider 105. If divc is in a first state, then dual-modulus divider 105 operates in a divide-by-4 mode, and if divc is in a second state, then dual-modulus divider 105 operates in a divide-by-5 mode. For proper operation, divc must be held in one of its two states for approximately one cycle of dual-modulus divider 105. In typical applications of prescaler 100 selection of divide-by-32 or divide-by-33 mode is performed by a circuit external to prescaler 100. This external circuit may be a programmable divider that receives output signal fout as its clock and generates modulus control signal mc on path 170. The mc signal will appear in one or the other of its states for the duration of one or more periods of fout. Decode logic 115 uses the mc signal and decodes the state of fixed modulus divider 110 to generate divc in a state corresponding to the state of mc for the required duration (approximately one cycle of dual-modulus divider 105).

Figure 2A:
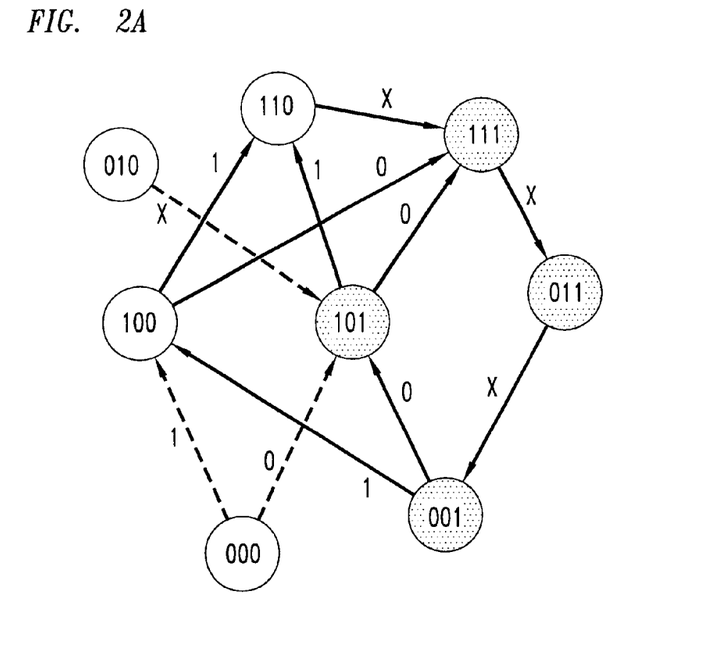
FIGS. 2A and 2B show state transition diagrams associated with the circuit of FIG. 1.
Figure 2B:
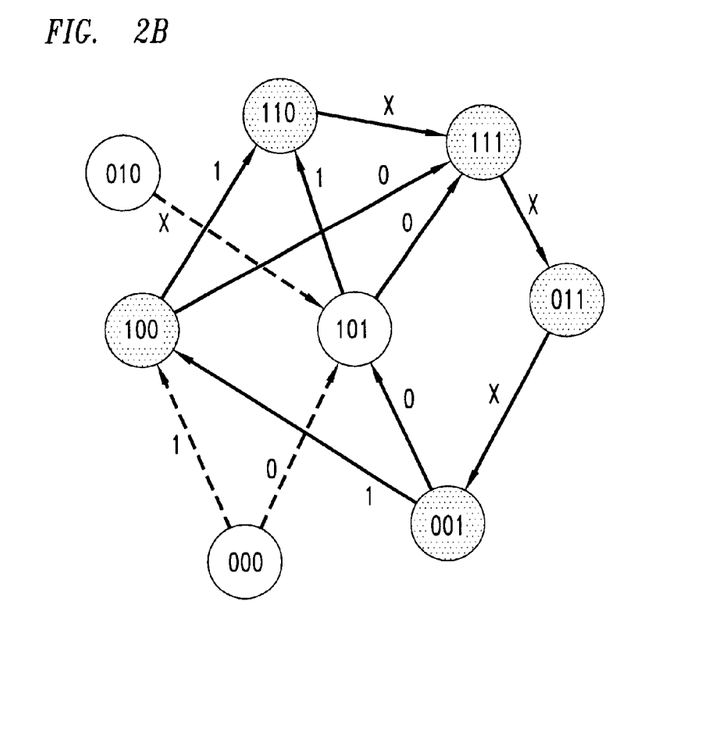

FIGS. 2A and 2B are state transition diagrams for the divide-by-4 and divide-by-5 modes of operation of divide circuit 105 of FIG. 1. In particular, each of these state transition diagrams show eight states represented by a three-bit sequence (Q1 Q2 Q3) associated with flip flops 145, 150 and 157, with the most significant bit (MSB) corresponding to the Q output of flip-flop 145 (Q1), the next bit corresponding to the Q output of flip-flop 150 (Q2), and the least significant bit (LSB) corresponding to the Q output of flip-flop 157 (Q3). The state machine reflected by FIGS. 2A and 2B is clocked by input clock signal fin on path 120 to synchronous divider 105.

Input control to the state machine is provided by divider control signal, divc, on path 135, with state machine transitions from one state to another during each clock period of the input signal occurring in response to the one-bit divc signal. Transitions are indicated in the FIGS. 2A and 2B by directional arrows labeled with divc values x, 0, or 1, where divc=x indicates "don't care," divc=0 indicates divide-by-4 mode, and divc=1 indicates a divide-by-5 mode. Thus, for example, if divc=0 and flip-flops 145, 150 and 157 are in respective states 1,0,0 (Q1=1; Q2=Q3=0), then /Q2=1, the output of NAND gate 155 is 1, and a 1 is clocked into flip-flop 157 while flip-flops 145 and 150 have 1's clocked in—thus giving rise to a new state of 111. But, if flip-flops 145, 150 and 157 exhibit a 110 state (Q1=1, Q2=1, and Q3=0), then the next state will be 111 regardless of whether divc is a 0 or a 1.

In the state transition diagrams of FIGS. 2A and 2B, crosshatched states are those from which transitions occur for the respective mode (divide by 4/5). The normal state transition path for the divide-by-4 mode (FIG. 2A) is: 111=>011=>001=>101. Similarly, normal sequence of state transitions in the divide-by-5 mode is: 111=>011 =>001= >100=>110. Two of the eight states (010 and 000) are start-up states that are not present in the normal divide by 4 or divide by 5 paths.

Figure 3:
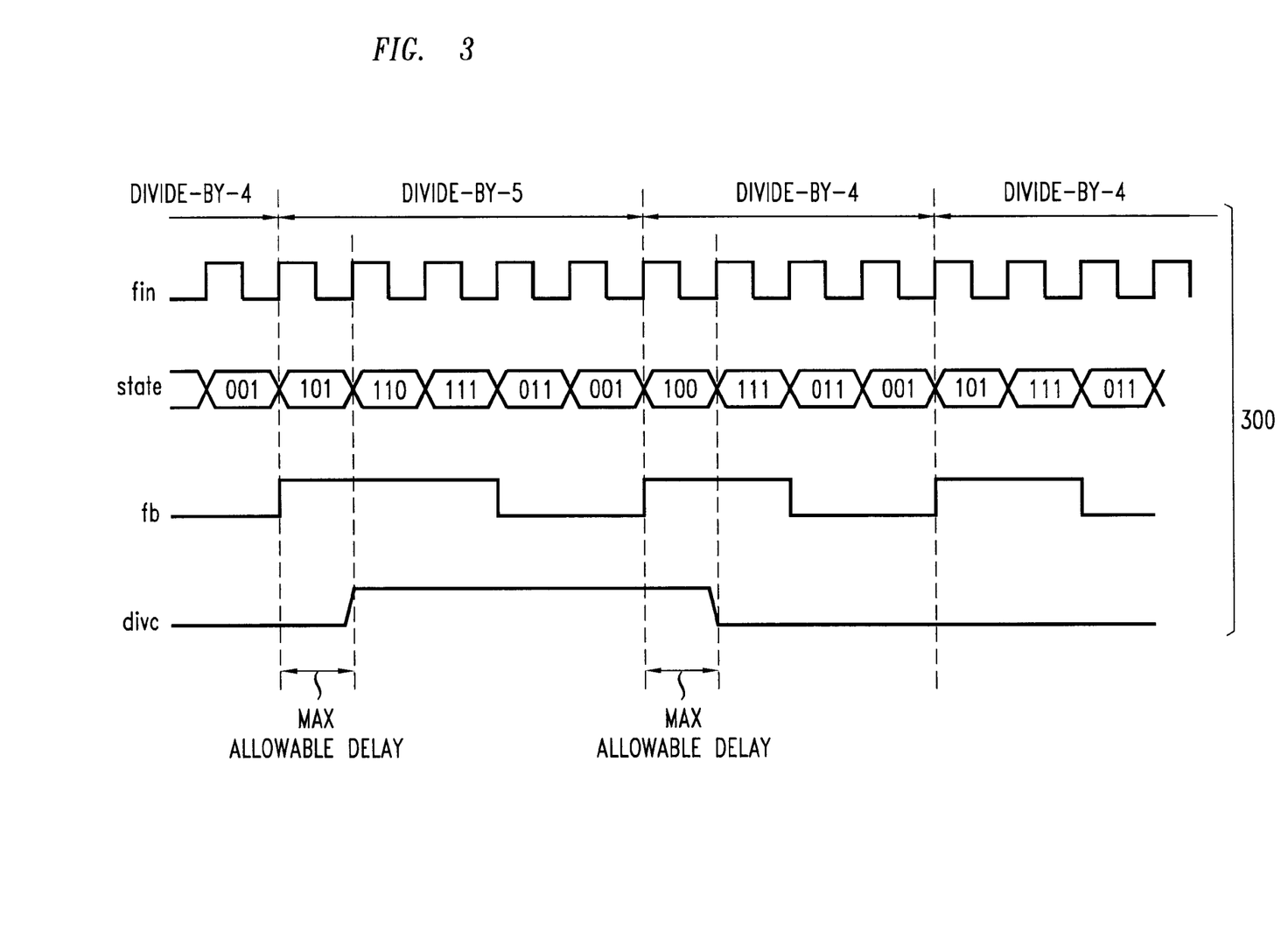
FIG. 3 is a timing diagram illustrating the timing of certain operations in the circuit of FIG. 1.

FIG. 3 is a timing diagram for operation of prescaler 100 of FIG. 1 illustrating clocking inputs (fin), states traversed in respective divide-by-5 and divide-by-4 operating modes and the state of each of the fb and divc signals. The waveform for divc in FIG. 3 shows a maximum allowable delay for the transition from one state to another. In particular, it will be appreciated that, because divc is generated, in part, in response to states of fixed modulus divider 115, and because states of divider 115 depend, in turn, on fb, a maximum of one input clock cycle can be counted on as the period in which the divc signal will settle after a rising edge occurs in the fb signal.

Since divide-by-4/5 circuits are important elements of prescaler operation, considerable effort has been devoted to insure that reliable high-speed operation is achieved in this sub-circuit. It has also proven desirable to employ relatively lower performance circuit structures for the fixed-modulus divider 110 and decode logic 115 to realize advantages in current drain and, in some cases, reduced circuit area and manufacturing costs. Nevertheless, optimum operation of dual-modulus dividers can be degraded by timing limitations of these lower performance elements. Moreover, simply speeding up performance of fixed modulus divider and decoding elements will not only incur increased fabrication costs, but will also incur increased power usage.

Accordingly, there exists a need for high-speed prescaler architectures operating at low power levels and low supply voltage that realize benefits of optimized performance of high-speed dual modulus dividers.

SUMMARY OF THE INVENTION

Limitations of the prior art are overcome and a technical advance is made in accordance with the present invention, typical embodiments of which are described below.

In accordance with one illustrative embodiment of the present invention prior prescaler organizations are modified by avoiding reliance on transitions in a divider control signal occurring within relatively narrow tolerances. Moreover, such modifications are accomplished at no penalty in manufacturing costs or increased power consumption.

In accordance with an aspect of illustrative embodiments of the present invention dual modulus divider state transitions giving rise to incrementing of fixed-modulus divider states are selected to be independent of possible short-term changes in divider control inputs to the dual modulus divider. Thus, for example, it proves possible to constrain state transitions from certain critical states in a dual modulus divider to occur only prior to a period of insensitivity to short-term instabilities in a dual-modulus divider control signal.

In realizing such improved operation it proves advantageous to select an output signal from a dual modulus divider that ensures that there will be a subsequent time interval sufficient to realize desired stability of a modulus selection signal for the dual-modulus divider in its next divide cycle.

BRIEF DESCRIPTION OF THE DRAWING FIGURES

The above-summarized invention will be more fully understood upon consideration of the following detailed description and the attached drawing wherein.

DETAILED DESCRIPTION

The following detailed description and accompanying drawing figures depict illustrative embodiments of the present invention. Those skilled in the art will discern alternative system and method embodiments within the spirit of the present invention, and within the scope of the attached claims, from consideration of the present inventive teachings.

Figure 4:
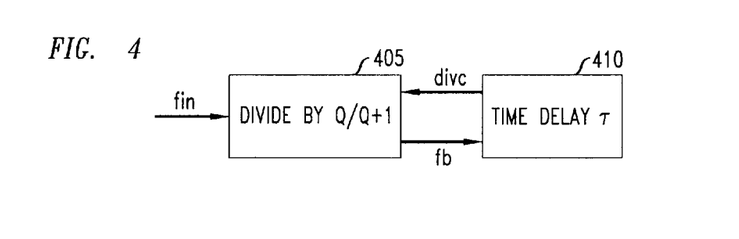
FIG. 4 is a diagram showing the relationship between certain time delays in the circuit of FIG. 1.

A further consideration of timing aspects of the prescaler circuit 100 of FIG. 1, as reflected in FIG. 3, shows that desired operation of the prescaler depends on modulus transitions in dual-modulus divider 105 occurring in a timely fashion. Specifically, synchronous divider 105 must receive a divc signal for a new divide cycle from decode logic 115 in time to determine whether the divide cycle should be a divide-by-4 cycle or a divide-by-5. Since the fixed modulus divider is clocked by the output signal, fb, of the synchronous divider, an update in the divc signal will appear some time delay, $\tau$, after a rising clock edge on fb. Therefore, for purposes of timing between sub-circuits of the circuit of FIG. 1, fixed modulus divider 110 and the decode logic 115 may be collectively viewed as a delay block 410 inserted between signal fb and divc as illustrated FIG. 4. In FIG. 4, block 405 represents the general case (Q/Q+1) dual modulus divider corresponding to the specific (4/5) dual modulus divider 105 in FIG. 1.

As the desired frequency of operation for prescaler circuits increases, inherent delay of fixed divider 110 and decode logic 115 becomes more important in determining the maximum operating frequency of a prescaler. In a typical applications, such as fractional-N synthesizers, various aspects of which are described in incorporated patent applications (i) through (iv) cited above, synchronous divider 105 in FIG. 1 operates at a VCO output frequency, here fin, the highest frequency signal in the prescaler. It will be seen from the arrangement of FIG. 1 that the highest possible frequency for the input, fb, to fixed modulus divider is fin divided by Q. Thus circuit architectures for fixed-modulus divider 110 and decoder 115 need not be speed-optimized to the extent as high-speed dual-modulus divider 105.

However, while maximum operating speeds of the individual sub-circuits 110 and 115 in FIG. 1 need not be as high as that for the high-speed dual modulus divider 105, overall frequency performance of prescalers having the general arrangement of that in FIG. 1 are a function of these operating speeds and tolerance for signal delays between the several units. In particular, in accordance with one aspect of illustrative embodiments of the present invention, it proves desirable to provide maximum tolerance in a dual-modulus divider to signal delay through other elements, such as fixed modulus divider 110 and decode logic 115 in FIG. 1. This ensures that a dual-modulus synchronous divider will have maximum flexibility in adapting to a change of state in sub-circuits such as fixed divider 110 caused by an output signal fb output from the dual modulus divider.

In particular, it has proven desirable to extend the time between a positive change in fb and the time by which a synchronous divider such as 105 in FIG. 1 must receive an updated divc signal in time to switch divider 105 from a divide by Q mode to a divide by Q+1 mode (or vice versa). Any such change in divc will occur (for a given externally applied value of mc) by a change in state of fixed modulus divider 110 in response to the indicated positive change in fb.

To better understand the manner of introducing present inventive modifications to prescaler circuits generally of the form shown in FIG. 1 it proves useful to more fully examine state transition diagrams shown in FIGS. 2A and 2B and the timing diagram of FIG. 3. Upon closer examination of these, it becomes clear that certain state transitions are more critical to improved operation of a dual modulus prescaler of the type shown in FIG. 1 than others. Specifically, it will be noted that transitions from states 001 and 101 (for the divide-by-4 sequence of states, and states 001 and 100 (for the divide-by-5 sequence of states) require that the divc signal be maintained at a stable desired level to ensure that the desired sequence of states is achieved. Overall, then, transitions from 001, 100, and 101 are critical transitions. Other transitions, those for which a don't-care (x) value for the divc signal is shown in FIGS. 2A and 2B, are less critical because these state transitions are the same regardless of the value of divc.

This critically of transitions from states 001, 100, and 101 is further illustrated in the timing diagram of FIG. 3, where, after a desired divide-by-5 state cycle has commenced with a positive transition of the fb signal—upon a transition in divider 105 to state 101 in response to a divc logical input of 0 from a prior state 001. In particular, if the divc signal has not become stable as a logical 1, an erroneous transition to state 111 (corresponding to a divc=0) could occur. At most, therefore, the time for settling of the divc=1 level, corresponding to a divide-by-5 state, is one clock cycle after the positive transition of fb.

Similar errors can potentially occur upon the beginning of a divide-by-4 cycle, also associated with a positive transition of fb as a transition occurs from the 001 state to the 100 state. In particular, state 100 can transition to either erroneous state 110 (divc=1) or, (with divc=0) to state 111, the correct next state for a divide-by-4 cycle. Thus, it is important that the correct divc state be settled by the time the next transition can occur, i.e., by the end of one input clock cycle in the circuit of FIG. 1.

By further examination of the state transition diagram of FIGS. 2A and 2B, it is seen. that the Q1 signal (the source of the fb signal in FIG. 1) changes from a 0 to a 1 on state transitions from 001=>101 and from 001=>100. Consequently, the 101 and 100 states can be termed the output states for the circuit of FIG. 1. For a zero delay in the divc signal, i.e., τ=0 in FIG. 4, the circuit of FIG. 1 would switch from the divide by 4 path to the divide by 5 path at the 101 critical state and from the divide by 5 path to the divide by 4 path at the 100 critical state. The 101 and 100 states are, therefore, the critical states where the divc signal must be updated and stable before the next state transition. In this architecture, the output states that generate an update to the fb signal are the same as the critical states that must receive the updated, delayed divc signal.

For example, assume dual-modulus divider 405 is currently in the 001 state with a 0 on the divc signal line. On the next fin clock cycle, the divider will move to the 101 state. At this time, a 0 to 1 transition will occur on the Q1 output signal (fb). Assume this transition causes the fixed modulus divider to output a signal to the decode logic which, in combination with a 1 signal on the prescaler modulus control line (mc), causes the divc signal to transition from 0 to 1. This indicates that the next cycle in the synchronous divider should be a divide-by-5 path. However, the divider must decide before leaving the 101 state to transition to the 110 state instead of the 111 state. The divider state will change on the next input frequency clock cycle, regardless of whether or not the divc signal has been updated from a 0 to a 1. If the 1 on the divc signal is not received before the next fin clock cycle, the synchronous divider will progress to the 111 state and miss the 110 state transition.

Therefore, in the conventional prescaler architecture of FIG. 1, the acceptable time delay for the update of the divc signal is less than one state transition. The time delay between each state transition is the inverse of the input frequency (fin) to the prescaler. As the operating frequency of the prescaler increases, the acceptable time delay τ, for the updated divc signal to be available and stable is reduced.

Figure 5:
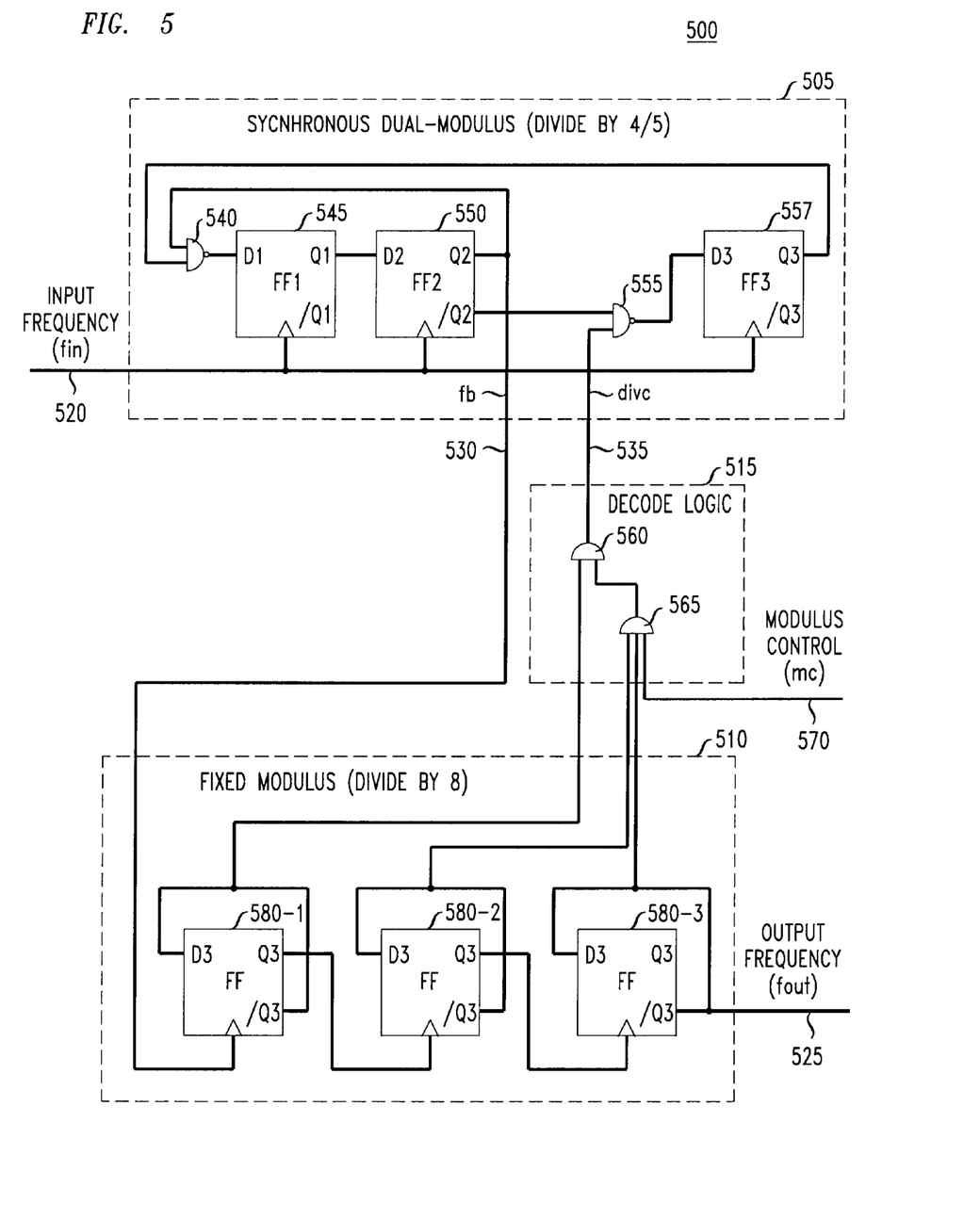
FIG. 5 is improved prescaler in accordance with an illustrative embodiment of the present invention.

FIG. 5 shows an improved prescaler 500 in accordance with one embodiment of the present invention. Again, a dual modulus divider 505 receives input signals at frequency fin and performs either a divide-by-4 or divide-by-5 function depending on the state of divc. The latter input is again derived in decode logic unit 515 from a desired modulus control input on path 570 and by inputs derived from the state of fixed-modulus divider 510. Fixed-modulus divider 510 and decode logic 515 illustratively comprise the same components as in the prescaler of FIG. 1 and function in the same way as corresponding sub-circuits in that circuit.

Dual modulus divider 505 is also arranged as in FIG. 1, except divided output signal fb used to increment fixed-divider 510 is derived as an output from Q2, rather than from Q1. While this adaptation, amounting to a selection of a time of occurrence for the above-noted critical states, is readily achieved, its effect on the manner of operation of fast reliable prescaler operation is significant. In particular, the modifications embodied in FIG. 5 extends the time by which the divc signal need be sufficiently settled to ensure the correctness of critical state transitions as described above.

Figure 6:
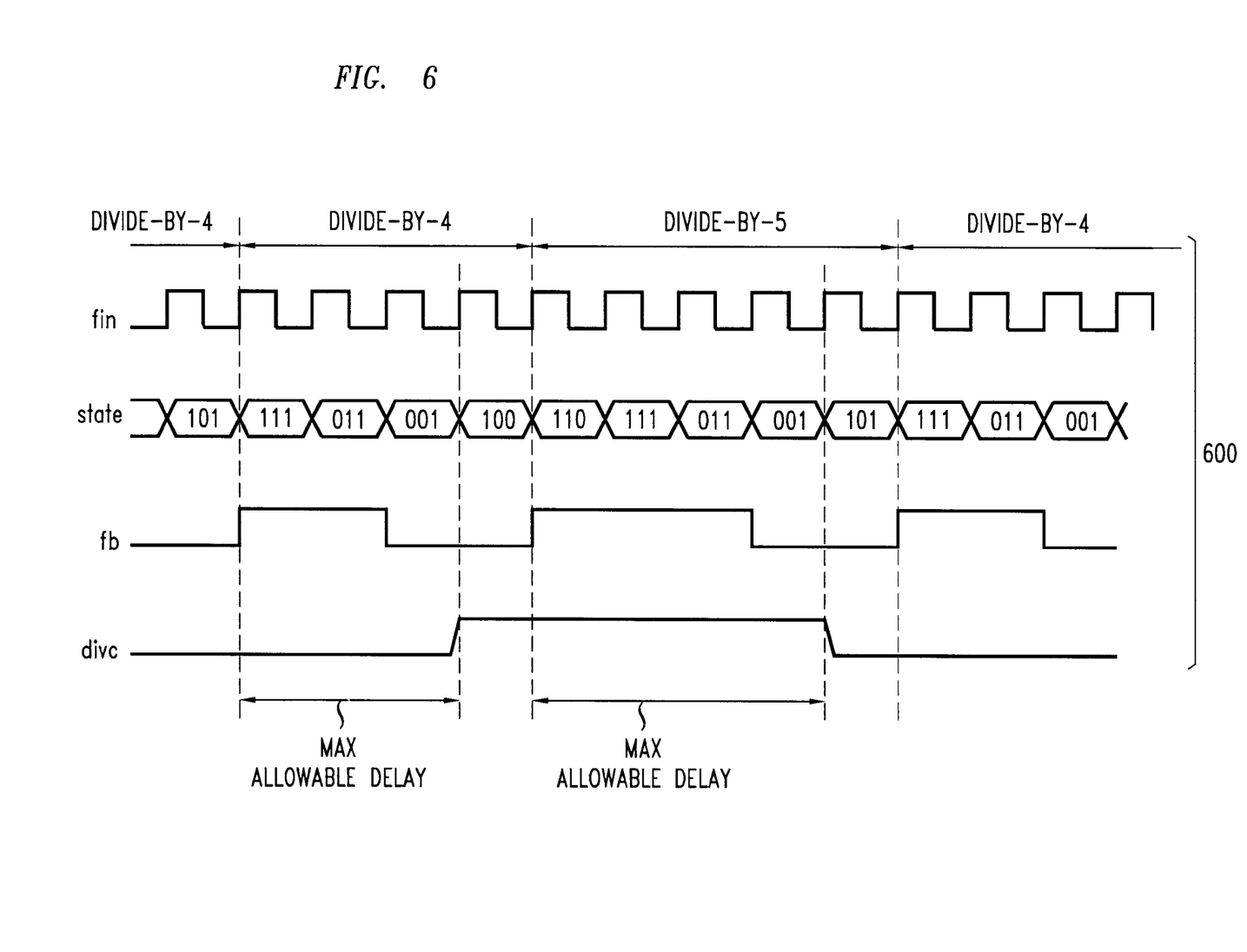
FIG. 6 is a timing diagram illustrating the timing of certain operations in the circuit of FIG. 5.

The manner in which such extended time for settling of divc may be achieved will be better understood by consideration of FIG. 6, a timing diagram for the improved prescaler circuit of FIG. 5. From the foregoing discussion a maximum delay margin between the occurrence of a positive transition on fb and reliance on a settled divc will occur when the number of non-critical states immediately following occurrence of this positive transition of fb should be maximized.

By analyzing the position of non-critical states relative to the position of critical states in the state transition diagram, maximum delay margin path can be located. In particular, examination of the state diagrams of FIGS. 2A and 2B reveals that state 110 in the divide-by-5 path and state 111 in the divide-by-4 path are immediately followed by the maximum number of non-critical states. To select the optimal output states, it is recognized that the second bit in the state code changes from 0 to 1 on state transitions from 101=>111 and 100=>110. Using the second bit in the state code as the fb signal places the new output states immediately prior to a maximum number of non-critical states, resulting in a vastly increased time delay margin.

Therefore, by selecting the Q2 output of FF2 as the fb signal to a positive-edge sensitive fixed modulus divider (or one of the equivalent implementations discussed below) the acceptable time delay is increased to three state transitions in divide-by-four mode and four state transitions in divide-by-five mode. This is an improvement over the prior art arrangement of FIG. 1 (where fb=Q1) and similar prior art prescaler circuits (where fb=/Q1). Though a four-state-transition delay margin is the maximum achievable time delay for a divide-by-4/5 dual modulus divider, other particular maximum delay cycles are achieved in higher-order dual modulus dividers.

To illustrate improved time delay margins achieved using embodiments of the present invention, the following example is offered in connection with FIG. 6. Assume a divide-by-4/5 synchronous dual-modulus divider is currently in the 101 state with a 0 on the divc signal line. On the next fin clock cycle, the divider will move to the 111 state. At this time, a 0 to 1 transition will occur on the Q2 output signal (fb). Assume this transition causes the fixed modulus divider to output a signal to the decode logic which, in combination with a 1 signal on the prescaler modulus control line (mc), causes the divc signal to transition from 0 to 1. This indicates that the next cycle in the synchronous divider should be a divide-by-5 cycle, and state transitions should be those associated with a divide-by-5 transition path.

Ideally, the dual-modulus divider of the current example would receive a stable updated value of divc=1 before transitioning from the 111 state to the next state, 011. However, since the path including the maximum number of immediately following noncritical states follows state of 111, a time delay in the arrival of the divc=1 signal will have no effect on the operation of the synchronous divider. In particular, the dual-modulus divider will transition from 111=>011 and from 011=>001 regardless of the value of the divc signal. The update to divc need only occur before the 101 state transitions to its next state. Therefore, the acceptable time delay on the divc signal for dual-modulus prescaler 500 has increased from less than one state transition (<1/fin seconds) to less than three state transitions (<3/fin seconds) in divide-by-four mode and less than four state transitions (<4/fin) in divide-by-five mode.

Implementations of embodiments of the present invention will illustratively employ high-speed, enhanced functionality building blocks in speed-critical circuit contexts. For example, flip-flops 545 and 557 in dual-modulus divider 505 will advantageously be Modified Full-Latch TSPC-1 Flip-Flops with corrective circuitry to prevent glitches and integrated NAND gate functionality as described in incorporated related patent application (iv) cited above. Flip-Flop 550 is advantageously a Modified Full-Latch TSPC-1 Flip-Flops with the corrective circuitry and added complementary outputs as described in incorporated related patent application (iv) cited above. Flip-flops 580-i in FIG. 5 are illustratively of a type described in J. Yuan and C. Svensson, "High-Speed CMOS Circuit Technique," in IEEE *J. Solid-State Circuits*, vol. 24, pp. 62–70, Feb. 1989, which flip-flops are well-known in the art. These latter flip-flops designs are sufficient for less demanding a synchronous ripple-counter implementations of a fixed modulus divider, such as divider 510 in FIG. 5. Decode logic 515 is advantageously implemented using standard CMOS logic circuitry. Those skilled in the art will recognize and apply other particular implementation technologies in realizing aspects of the present invention.

Thus, an improved dual-modulus prescaler embodying principles of the present invention allows the prescaler to continue proper operation at a higher input frequency than the conventional prescaler architectures for a given time delay between the fb and divc signals.

While specific embodiments of the present invention described above in connection with FIGS. 5 and 6 enjoy particular advantages as compared with prior prescalers, it will be realized that numerous alternative configurations based on the above inventive teachings will occur to those skilled in the art. So, for example, fixed modulus divider 510 can be made sensitive to either rising edges (using positive edge-triggered flip-flops) or falling edges (using negative edge-triggered flip-flops) of an fb signal. Then, either of the Q2 or /Q2 flip-flop outputs from synchronous dual-modulus divider 505 can be used in supplying the fb output signal to fixed-modulus divider 510 in particular cases. That is, Q2 will advantageously be used to supply the fb output when fixed modulus divider 510 employs positive edge-triggered flip-flops, while /Q2 will advantageously be used to supply the fb output signal when fixed modulus divider 510 employs negative edge-triggered flip-flops.

Other combinations of output sources for fb and edge-triggering polarities of fixed modulus dividers may be employed using additional well-known circuit modifications. Thus, for example, an inverter may be inserted in the fb path between one of the Q2 or /Q2 outputs of dual-modulus divider 505 and the input of the fixed modulus divider to accommodate the particular type of flip-flops used in fixed-modulus divider 510 while adhering to the inventive teachings above. In any of these cases, the state diagram for the divide-by-4/5 configuration does not change.

Overall, it proves advantageous to select optimal output states from state diagrams such as those in FIGS. 2A and 2B, viz., those output states that are followed by a sufficient number of don't care transitions to allow for useful increased delay margin. Of course, less than maximum delay margins can be chosen in particular cases. For example, it may proved desirable or expedient in some cases where Q>4 where the state diagram has a sufficient number of don't care transitions to select an output state that is followed by two (or more) don't-care transitions in particular cases, provided that the resulting extended settling period is sufficient for divc in a prescaler operating under particular speed and frequency conditions.

Further, prescalers employing a variety of dual-modulus dividers (generically Q/Q+1) in addition to 4/5 dividers discussed by way of illustration above, a variety of fixed-modulus dividers in addition to divide-by-8 dividers used by way of illustration above, and combinations of various Q/Q+1 and fixed dividers will apply the present inventive teaching to advantage.

While the above detailed description has illustratively employed a dual-modulus divider and consequent dual-modulus prescaler, it will be recognized by those skilled in the art that the same inventive principles described above may be applied to N-modulus dividers and prescalers, for N>2. In such N-modulus circuits will employ a divc signal having one of N values for the period appropriate to control a divide-by-$Q_i$ cycle, where $Q_i, i=1,2, \ldots, N$.

What is claimed is:

1. A plural-state dual-modulus divider circuit for dividing an input clock signal at a frequency, fin, by either of a first modulus Q or a second modulus Q+1, where Q is a positive integer, said divider comprising means for representing a first sequence of Q consecutive states and a second sequence of Q+1 consecutive states, said first and second sequences of states including some states in common, state transitions occurring in said first and second sequences in selected intervals of 1/fin, means for controlling less than all of said state transitions in each of said first and second sequences of states in response to a two-valued input signal divc, remaining ones of said state transitions being independent of said value of said divc, means for generating an output clock signal, fb, said fb having a period of Q*1/fin for said first sequence of states and (Q+1)*1/fin for said second sequence of states, said fb commencing at a state transition that is followed by at least one state transition that is independent of said value of divc.

2. The divider of claim 1 wherein said means for generating comprises means for generating said fb at a state transition that is followed by the maximum number of consecutive state transitions that are independent of said value of divc.

3. The divider of claim 1 wherein said means for representing said Q consecutive states comprises a plurality of clocked flip-flop circuits receiving said input clock signal as a clocking signal.

4. The divider of claim 3 wherein said flip-flop circuits are high-speed true-single-phase flip-flops.

5. The divider of claim 3 wherein said means for generating said fb comprises means for deriving said fb from one of said plurality of clocked flip-flop circuits.

6. The divider of claim 1 wherein Q=4, and wherein said maximum number of consecutive state transitions that are independent of said value of divc is four.

7. The divider of claim 3 wherein Q=4, and wherein said plurality of clocked flip-flop circuits comprises three clocked flip-flop circuits interconnected by feedback paths.

8. The divider of claim 5 wherein

Q=4, said plurality of clocked flip-flop circuits comprises first, second and third ordered clocked flip-flop circuits interconnected by feedback paths, and said means for generating said fb signal comprises means for deriving said fb signal as an output of said second ordered clocked flip-flop circuits, said means for controlling comprises a first gate for NANDing said divc signal and said fb signal to provide an input to said third ordered flip-flop circuit, whereby said divider provides four consecutive state transitions that are independent of said value of divc.

9. The divider of claim 8 wherein said feedback paths comprise a first feedback path from an output of said third ordered flip-flop circuit to a first input to a second NAND gate, said second NAND gate having first and second inputs and an output, a second feedback path from an output of said second ordered flip-flop circuit to said second input to said second NAND gate, said output of said second NAND gate providing an input to said first ordered flip-flop circuit.

10. A dual-modulus divider for dividing an input clock signal having a frequency, fin, and a period 1/fin, by either of a first modulus Q or a second modulus Q+1, where Q is a positive integer, said dual-modulus divider comprising means for representing a plurality of divider states, some of which states are critical states, the remainder of said states being non-critical states, and means for generating an output clock signal, fb, in response to said input clock signal and a two-valued input control signal, divc, said fb having a frequency equal to fin*(1/Q) when said divc has a first stable value at a first predetermined time >1/fin following a first critical state, and fin*1/(Q+1) when said divc has a second stable value at a second predetermined time >1/fin following a second critical state.

11. The dual-modulus divider of claim 10 wherein said first and second predetermined times are given by N*1/fin, N being an integer greater than 1.

12. The dual-modulus divider of claim 10 wherein said means for representing a plurality of states comprises means for representing a first sequence of Q consecutive states and a second sequence of Q+1 consecutive states, said first and second sequences of states including some states in common, state transitions occurring in said first and second sequences in selected intervals of 1/fin, each of said first and second sequences of states comprising at least one of said critical states.

13. The dual-modulus divider of claim 12 further comprising means for controlling less than all of said state transitions in each of said first and second sequences of states in response to said divc signal, remaining ones of said state transitions being independent of said value of said divc.

14. The divider of claim 10 wherein said means for representing a plurality of divider states comprises a plurality of ordered clocked flip-flop circuits interconnected by feedback paths and receiving said input clock signal as a clocking signal, and wherein said output clock signal, fb, is provided as an output of one of said ordered flip-flop circuits.

15. A prescaler circuit comprising a dual-modulus divider for dividing an input clock signal at a frequency, fin, by either of a first modulus Q or a second modulus Q+1, where Q is a positive integer, said dual-modulus divider comprising means for representing a plurality of states, some of which states are critical states, the remainder of said states being non-critical states, and means for generating an output clock signal, fb, in response to said input clock signal and a two-valued input control signal, divc, said fb having a frequency equal to fin*(1/Q) when said divc has a first stable value at a first predetermined time >1/fin following a first critical state, and fin*1/(Q+1) when said divc has a second stable value at a second predetermined time >1/fin following a second critical state, a fixed-modulus divider having a plurality of states, said fixed-modulus divider receiving said fb and generating a prescaler output signal at a frequency fout, and a first set of state signals reflecting the state of said fixed-modulus divider, and a decoding circuit for generating said divc signal in response to said first set of state signals, and a received modulus control input.

16. The prescaler of claim 15 wherein Q=4.

17. The prescaler of claim 16 wherein said fixed-modulus divider is a divide-by 8 divider, whereby said prescaler is a divide-by-32/33 prescaler.

18. The prescaler of claim 16 wherein said means for representing a plurality of states comprises first, second and third ordered clocked flip-flop circuits interconnected by feedback paths, and said fb signal is taken as an output of said second ordered clocked flip-flop circuits.

19. The prescaler of claim 18 wherein said second ordered flip-flop circuit comprises complementary outputs Q2 and /Q2, and wherein said fb signal is taken as the signal on Q2 when said fixed-modulus divider comprises positive edge-triggered flip-flops and /Q2 when said fixed-modulus divider comprises negative edge-triggered flip-flops.

20. The prescaler of claim 16 wherein said means for representing a plurality of states comprises first, second and third ordered clocked flip-flop circuits interconnected by feedback paths, wherein said second ordered flip-flop circuit comprises complementary output signals Q2 and /Q2, and said fb signal is taken as an output of said second ordered clocked flip-flop circuits, said dual-modulus divider further comprising a first gate for NANDing said divc signal and said Q2 signal to provide an input to said third ordered flip-flop circuit, whereby said divider provides at least three consecutive state transitions that are independent of said value of divc.

21. The prescaler of claim 20 wherein said first, second and third flip-flop circuits are high-speed true-single-phase flip-flops.

22. A multiple-modulus divider for selectively dividing an input clock signal having a frequency, fin, and a period 1/fin, by one of a plurality of moduli $Q_i$, i=1, 2, ... N, where each $Q_i$ is a positive integer, said multiple-modulus divider comprising means for representing a plurality of divider states, some of which states are critical states, the remainder of said states being non-critical states, and means for generating an output clock signal, fb, in response to said input clock signal and a N-valued input control signal, divc, said fb having a frequency equal to fin*(1/$Q_i$) when said divc has an ith stable value at a predetermined time >1/fin following an ith critical state.

23. The multiple-modulus divider of claim 22 wherein said first and second predetermined times are given by K/fin, K being an integer greater than 1.

24. The multiple-modulus divider of claim 22 wherein said means for representing a plurality of states comprises means for representing N sequences of states, the ith of said sequences of states comprising a sequence of $Q_i$ consecutive states, said N sequences of states including some states in common, state transitions occurring in each of said N sequences of states in selected intervals of 1/fin, each of said N sequences of states comprising at least one of said critical states.

25. The multiple-modulus divider of claim 24 further comprising means for controlling less than all of said state transitions in each of said N sequences of states in response to said divc signal, remaining ones of said state transitions being independent of said value of said divc.

26. The multiple-modulus divider of claim 22 wherein said means for representing a plurality of divider states comprises a plurality of ordered clocked flip-flop circuits interconnected by feedback paths and receiving said input clock signal as a clocking signal, and wherein said output clock signal, fb, is provided as an output of one of said ordered flip-flop circuits.

* * * * *